United States Patent [19]

Furuyama

[11] 4,398,267

[45] Aug. 9, 1983

[54] SEMICONDUCTOR MEMORY DEVICE

[75] Inventor: Tohru Furuyama, Yokohama, Japan

[73] Assignee: Tokyo Shibaura Denki Kabushiki Kaisha, Kawasaki, Japan

[21] Appl. No.: 212,103

[22] Filed: Dec. 2, 1980

[30] Foreign Application Priority Data

Dec. 11, 1979 [JP] Japan .................................. 54-160522

[51] Int. Cl.³ ........................ G11C 11/40; H01L 29/78
[52] U.S. Cl. .................................. 365/182; 307/238.8; 357/23
[58] Field of Search ............... 365/182, 177, 150, 184, 365/187, 188; 357/23 R, 23 C, 23 TF, 41, 59; 307/238.8, 575, 584, 304

[56] References Cited

U.S. PATENT DOCUMENTS 3,387,286  6/1968  Dennard ............................ 340/173
4,139,786  2/1979  Raymond et al. .................. 365/182

FOREIGN PATENT DOCUMENTS

53-97384  8/1978  Japan ............................... 357/59 R

*Primary Examiner*—John C. Martin
*Attorney, Agent, or Firm*—Finnegan, Henderson, Farabow, Garrett & Dunner

[57] ABSTRACT

A plurality of memory cells are arranged on a semiconductor substrate in the matrix form. Each memory cell comprises a first MOS field effect transistor whose drain electrode is connected to a read bit line, and whose source electrode is connected to a read word line, and a second MOS field effect transistor whose source electrode is connected to the gate electrode of the first MOS field effect transistor, and whose drain electrode is connected to a write bit line, and whose gate electrode is connected to a write word line. The first MOS field effect transistor is formed in the surface region of the semiconductor substrate and the second MOS field effect transistor is formed of a polycrystalline silicon layer, which is deposited on the semiconductor substrate with an oxide layer interposed therebetween to act as the gate region of the first MOS field effect transistor.

18 Claims, 11 Drawing Figures

SEMICONDUCTOR MEMORY DEVICE

BACKGROUND OF THE INVENTION

This invention relates to a semiconductor memory device, and more particularly to a dynamic metal oxide semiconductor (abbreviated as MOS) memory device.

Hitherto, a dynamic MOS memory has been widely accepted as a random access memory (abbreviated as RAM) from the standpoint of ensuring high density of integration and low power consumption. A 1-bit memory cell of the initially developed dynamic MOS memory is formed of three MOS field effect transistors (abbreviated as FETs). Where a voltage is impressed on a write word line connected to the memory cell by means of a driver provided in the memory, then data of a write bit line is written in a capacitor. Where a voltage is impressed on a read word line connected to the memory cell, then the occurrence or absence of a discharge in a read bit line, namely, a drop in the potential of the read bit line or the sustenance of the potential is denoted by the corresponding binary code of "0" or "1."

With the above-mentioned prior art dynamic MOS memory in which each memory cell comprises three transistors, a large number of wires have to be used, presenting difficulties in appreciably increasing integration density.

For elevation of integration density, a different type of dynamic MOS memory has been proposed in which each memory cell is formed of one MOS FET and one capacitor. With this proposed memory device, the MOS FET has the drain electrode connected to a bit line, the gate electrode connected to a read-write word line, and the source electrode grounded through the capacitor. Since the MOS FET does not have an amplifying function, a signal fetched from the capacitor to the bit line has such a voltage as is arrived at by dividing a capacitor voltage by a sum of a capacitor capacitance and bit line capacitance and multiplying the resultant quotient by the capacitor capacitance. In other words, the larger the number of memory cells connected to a data line, and the larger the capacitance of the data line, then the lower the voltage level of a signal fetched from the data line. The bit line generally has a capacitance 10 to 20 times larger than that of the capacitor. Therefore, a signal fetched from the memory cell has a far lower voltage than in the case of the aforesaid memory device of the 3 transistors—1 memory cell type. Consequently, it has been demanded to provide a sense amplifier capable of effectively detecting a signal, however low its voltage level may be. However, this requirement naturally increases the cost of a memory device. Further, a pair of load transistors for driving a flip-flop type sense amplifier often have different threshold voltages, giving rise to variations of properties peculiar to such sense amplifier. These variations lead to noise whose effect cannot be overlooked. Where memory cells and a sense amplifier are extremely reduced in size for high integration, then a read signal, that is, an input signal to the sense amplifier is also considerably decreased in voltage. However, a noise occurring in the sense amplifier remains little changed in voltage. In high integration, therefore, a read signal and a noise often have substantially the same level of voltage, obstructing the regular operation of a memory device.

SUMMARY OF THE INVENTION

It is accordingly the object of this invention to provide a semiconductor memory device which allows for the elevation of integration density without causing a read signal appearing on a bit line, that is, an input signal to a sense amplifier to be extremely reduced in voltage.

To attain the above-mentioned object, this invention provides a semiconductor memory device which is provided with a first MOS FET and a second MOS FET whose current path is connected at one end to a gate of the first MOS FET comprises a semiconductor substrate of a first conductivity type which constitutes a channel of either of the two MOS FETs, and a polycrystalline semiconductor layer which is formed on the semiconductor substrate with an oxide layer interposed therebetween to constitute the channel of the other MOS FET.

DETAILED DESCRIPTION OF THE PREFERRED EMBODIMENTS

Figure 1:
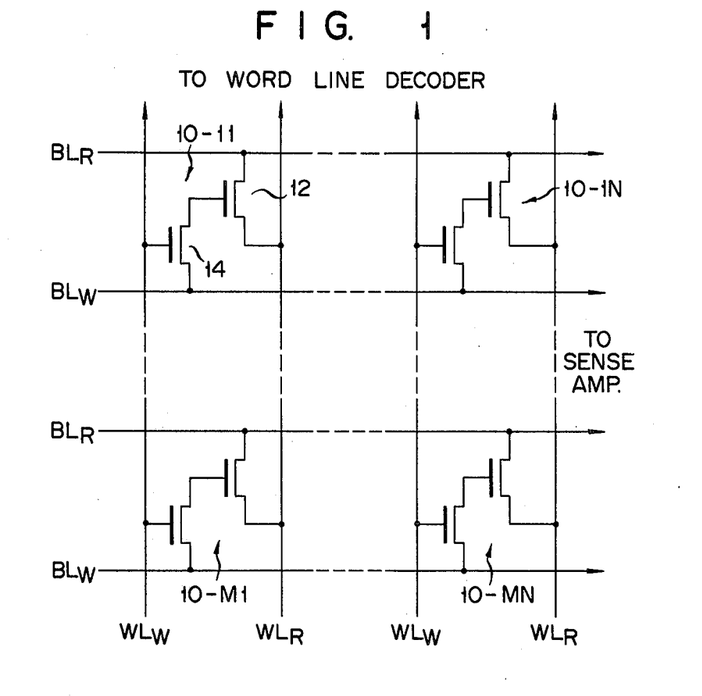
FIG. 1 is an equivalent circuit diagram of a semiconductor memory device according to one embodiment of this invention.

Description is now given with reference to the accompanying drawings a semiconductor memory device according to one embodiment of this invention. FIG. 1 is an equivalent circuit diagram of a memory device in which an M×N number of memory cells are arranged in the matrix form of 10-11 to 10-MN. Since the respective memory cells are of the same arrangement, reference is only made to one of them, description of the others being omitted. A gate of a first MOS FET 12 is connected to a source electrode of a second MOS FET 14. A junction of the gate and source electrodes constitutes a memory node. The first and second MOS FETs 12 and 14 are chosen to have the same property and be of an N channel enhancement type alike. The gate of the second MOS FET 14 is connected to a write word line $WL_W$. The drain electrode of the second MOS FET 14 is connected to a write bit line $BL_W$. The source electrode of the first MOS FET 12 is connected to a read word line $WL_R$. The drain electrode of the first MOS FET 12 is connected to a read bit line $BL_R$. The other memory cells are connected to the bit lines and word lines in the same manner as described above. Word lines are connected to a word line decoder.

Bit lines are connected to a sense amplifier through a bit line decoder. The sense amplifier is selectively connected to an I/O bus line in accordance with the voltage level of an output signal from the bit line decoder.

Figure 2:
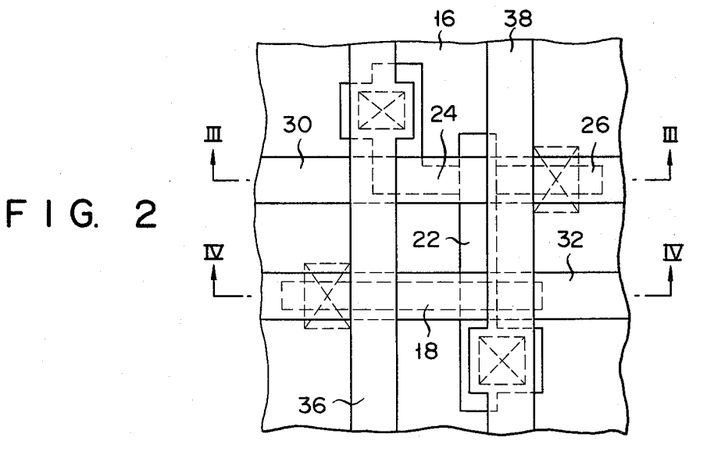
FIG. 2 shows an integrated pattern of one memory cell of the semiconductor memory device of FIG. 1.
Figure 3:
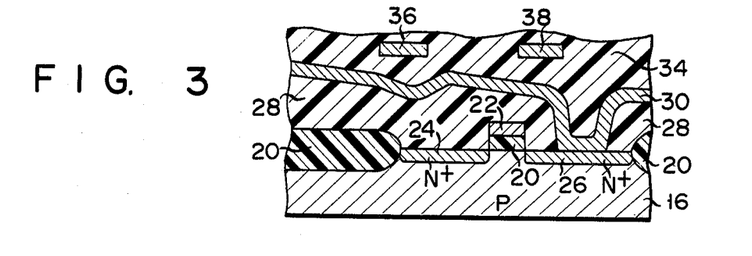
FIG. 3 is a sectional view on line III—III of FIG. 2.
Figure 4:
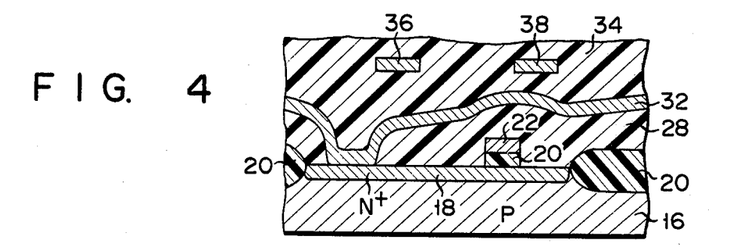
FIG. 4 is a sectional view on line IV—IV of FIG. 2.

Description is now given of the arrangement of integrated memory cells in accordance with one embodiment of this invention. FIG. 2 shows a pattern of one of the integrated memory cells (an oxide layer is not shown). FIG. 3 is a sectional view on line III—III of FIG. 2. FIG. 4 is a sectional view on line IV—IV of FIG. 2. An elongated N+ type semiconductor region 18 is diffused in the surface area of a P type silicon substrate 16. An elongated polycrystalline silicon layer 22 intersecting the N+ type semiconductor region 18 at right angles is formed on the P type silicon substrate 16 with an oxide layer 20 interposed therebetween. With the polycrystalline silicon layer 22 used as a mask, N+ semiconductor regions 24 and 26 are diffused in the surface area of the P type substrate 16. With one MOS FET, the gate region is formed of the polycrystalline silicon layer 22, the drain region is formed of the N+ semiconductor region 24 and the source region is formed of the N+ semiconductor region 26. With the other MOS FET, the gate region is formed of the N+ semiconductor region 18, and both drain and source regions are formed of the polycrystalline silicon layer 22. With the above-mentioned embodiment, the gate electrode of the first MOS FET 12 is connected to the source electrode of the second MOS FET 14. Therefore, the first MOS FET 12 is constituted by the polycrystalline silicon layer 22, and N+ semiconductor regions 24 and 26.

An oxide layer 28 (FIG. 3) is formed by the chemical vapor deposition (CVD) process on the P type silicon substrate 16 and polycrystalline silicon layer 22. Elongated polycrystalline layers 30 and 32 are formed on the oxide layer 28 in parallel with each other as shown in FIG. 2. The polycrystalline silicon layer 30 contacts the N+ semiconductor region 26. Since this N+ semiconductor region 26 constitutes the source region of the first MOS FET 12, the polycrystalline silicon layer 30 acts as a read word line $WL_R$. The polycrystalline silicon layer 32 contacts the N+ type semiconductor region 18. Since this N+ type semiconductor region 18 constitutes the gate region of the second MOS FET 14, the polycrystalline silicon layer 32 forms a write word line $WL_W$.

An oxide layer 34 is formed by the CVD process on the P type semiconductor substrate 16 and polycrystalline silicon layers 30 and 32. Parallel aluminum wires 36 and 38 are laid in the oxide layer 34 in a state intersecting the polycrystalline layers 30 and 32 at right angles. The aluminum wire 36 contacts the N+ type semiconductor region 24. Since this N+ type semiconductor region 24 forms the drain region of the first MOS FET 12, the aluminum wire 36 acts as a read bit line $BL_R$. The aluminum wire 38 contacts the polycrystalline silicon layer 22. The junction of the aluminum wire 38 and polycrystalline silicon layer 22 forms the drain electrode of the second MOS FET 14. That portion of the polycrystalline silicon layer 22 which lies opposite to the drain region of the second MOS FET 14 as viewed from the N+ type semiconductor region 18 forms the source region of the second MOS FET 14. That portion of the polycrystalline silicon layer 22 which is mounted on the N+ region 24 (with the oxide layer 20 interposed therebetween) constitutes the gate region of the first MOS FET 12. The aluminum wire 38 acts as a write bit line $BL_W$. The first MOS FET 12 is formed on the silicon substrate by the ordinary silicon gate process. The source and drain regions and channel region of the second MOS FET 14 are formed on a polycrystalline silicon layer 22 acting as the gate region of the first MOS FET 12. Therefore, a memory cell only occupies a small area, though constituted by two MOS FETs.

In the ordinary silicon gate process, an impurity is not diffused below a polycrystalline silicon layer. Therefore, before the formation of the polycrystalline silicon layer 22, an N+ type impurity is previously diffused by ion implantation in that portion of the first N+ type semiconductor region 18 which lies under the polycrystalline silicon layer 22 to act as the gate electrode of the second MOS FET 14.

Description is now given of the operation of the equivalent circuit of FIG. 1 according to a first embodiment of this invention. The binary codes "0" and "1" detected by the sense amplifier respectively denote signals having high and low potential levels (hereinafter simply referred to as "high and low levels"). The memory node is set at a high level with respect to data denoted by the binary code "0," and at a low level with respect to data represented by the binary code "1." In the initial stage of operation, a word line decoder and bit line decoder cause a write bit line $BL_W$, read bit line $BL_R$ and write word line $WL_W$ to be set at a high level, and a read word line $WL_R$ to be set at a low level.

In the case of reading, a read word line $WL_R$ of that memory cell from which data is fetched is set at a low level. Where data denoted by a binary code "0" is stored, then the first MOS FET 12 is rendered conducting, because its gate is set at a high level. As a result, current flows from the read bit line $BL_R$ set at a high level to a read word line $WL_R$ set at a low level through the first MOS FET 12. Consequently, the read bit line $BL_R$ has its potential reduced to a low level, and data represented by the binary code "0" is detected by the sense amplifier. Where data denoted by the binary code "1" is stored, then the first MOS FET 12 remains non-conducting, causing the read bit line $BL_R$ to have a high potential. If the read bit line $BL_R$ is permitted to float during reading, then it is possible to reduce the potential of the read bit line $BL_R$ to zero volts, where data represented by the binary code "0" is stored. Therefore, the semiconductor memory device of this invention has the advantage that a broader range is allowed for an operation voltage than in the prior art MOS memory of the 1 transistor-1 memory cell type. In practice, it is unnecessary to let the potential of the read bit line $BL_R$ drop to zero volts only by the MOS FET of the memory cell. When the potential has fallen to a certain extent, it is advised to amplify the potential of the read bit line $BL_R$ by a sense amplifier. Where a sense amplifier is used, it is possible to connect the read bit line $BL_R$ to a load element which is supplied with power only during reading. The semiconductor memory device of FIG. 1 may further comprises an MOS FET which is supplied with current about half as large as that which flows through the first MOS FET 12 of the memory cell in order to provide a reference voltage which is applied in determining whether a binary code detected by the sense amplifier is "0" or "1." After a read cycle is brought to an end, the respective data lines are brought back to the initial condition.

Where the previously read data is written again, then the write bit line $BL_W$ is set at an inverted condition of the read bit line BL$_R$ during reading. In other words, where data represented by the binary code "0" is read out, then the write bit line BL$_W$ is set at a high level. Where data denoted by the binary code "1" is read out, then the write bit line BL$_W$ is set at a low level. In this case, the write word line WL$_W$ is set at a high level. As a result, the second MOS FET 14 is rendered conducting, causing the memory node to be set at the same level as that of the write bit line BL$_W$. Where data represented by the binary code "0" is stored in the memory node, then the read bit line BL$_R$ is set at a low level, and the write bit line BL$_W$ is set at a high level. Therefore, the memory node is again set at a high level.

In the case of writing, it is advised to set the write bit line BL$_W$ during above-mentioned rewriting at that level which corresponds to the binary code denoting data to be written, regardless of data already stored up to this point. For example, where it is desired to write data represented by the binary code "0," then the write bit line BL$_W$ is set at a high level. Where the write word line WL$_W$ is set at a high level, then the second MOS FET 14 is rendered conducting, a causing the memory node to be set at the above-mentioned high level of the write bit line BL$_W$. Thereafter the respective bit lines and word lines are brought back to the initial condition.

With the semiconductor memory device of this invention, the polycrystalline silicon layer acting as the gate electrode of the first MOS FET 12 concurrently constitutes, as previously described, the source, drain and channel regions of the second MOS FET 14. As compared, therefore, with the conventional semiconductor memory device in which the first and second MOS FETs are formed by the silicon gate process, an area occupied by the semiconductor memory device of the invention is more reduced to the extent that a contact hole need not be provided due to contact between the gate electrode of the first MOS FET 12 and the source electrode of the second MOS FET 14.

Further, current is permitted to pass through a bit line by means of the first MOS FET 12 of the memory cell, enabling an input signal to the sense amplifier to have a higher voltage. Consequently, the sense amplifier is not rigidly demanded to have a high performance. It is, therefore, possible to connect a larger number of memory cells than in the past to a single bit line, thereby elevating integration density. Further, the peripheral circuit of the sense amplifier is much more simplified, ensuring the high speed operation of a semiconductor memory device and the saving of its power consumption.

Where the arrangement of the semiconductor memory device of this invention is compared with that of the conventional semiconductor memory device in which the first and second MOS FETs are formed by the silicon gate process, one memory cell of the present semiconductor memory device is reduced in size about 50%. This means that the memory cell of the present semiconductor memory device occupies an area only about 1.3 to 1.4 times larger than that of the conventional semiconductor memory device of the 1 transistor—1 memory cell type. Such increase in the area of one memory cell can be sufficiently offset by the peripheral circuit of the sense amplifier, because a read signal has a high voltage.

Figure 5:
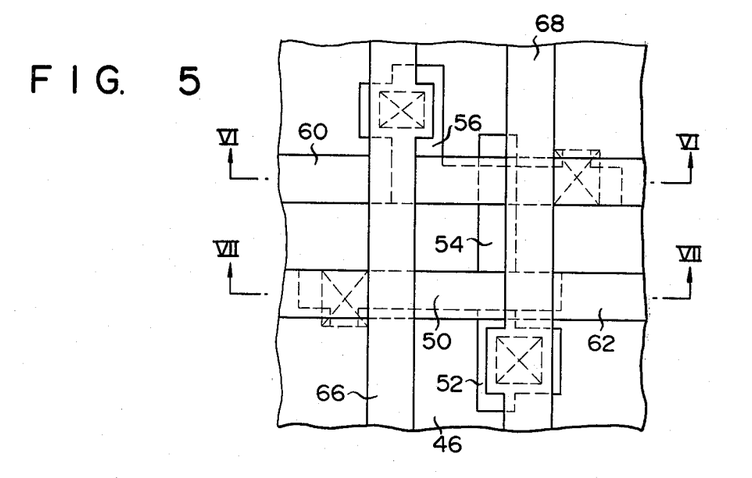
FIG. 5 indicates another integrated pattern of one memory cell of the semiconductor memory device of FIG. 1.

Description is now given of a memory cell according to another embodiment whose equivalent circuit is shown in FIG. 1. FIG. 5 indicates another pattern of one of the memory cells according to this embodiment.

Figure 6:
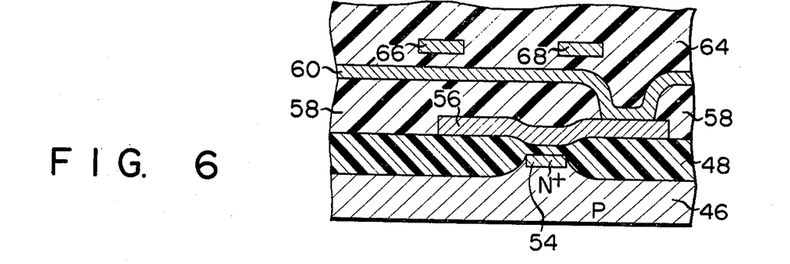
FIG. 6 is a sectional view on line VI—VI of FIG. 5.
Figure 7:
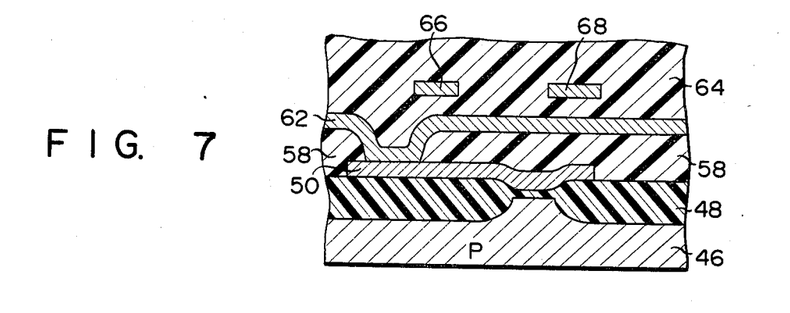
FIG. 7 is a sectional view on line VII—VII of FIG. 5.

FIG. 6 is a sectional view on line VI—VI of FIG. 5.
FIG. 7 is a sectional view on line VII—VII of FIG. 5.
An elongated polycrystalline silicon layer 50 is deposited on a P type silicon substrate 46 with a silicon oxide layer 48 interposed therebetween. Elongated N$^+$ type semiconductor regions 52 and 54 are diffused in the surface region of the P type silicon substrate 46 with the polycrystalline silicon layer 50 used as a mask. A polycrystalline silicon layer 56 is formed on the P type silicon substrate 46 with the silicon oxide layer 48 interposed therebetween, in such a manner that part of the polycrystalline silicon layer 56 intersects the N$^+$ type semiconductor region 54 at right angles. Polycrystalline silicon layers 60 and 62 are deposited in parallel with each other on the polycrystalline silicon layers 50 and 56 with a CVD oxide layer 58 interposed. The polycrystalline silicon layer 60 contacts the polycrystalline silicon layer 56. That end of the polycrystalline silicon layer 56 is used as the source region of the first MOS FET 12. The polycrystalline silicon layer 60 constitutes a read word line WL$_R$. The polycrystalline silicon layer 62 contacts the polycrystalline silicon layer 50. This polycrystalline silicon layer 50 acts as the gate region of the second MOS FET 14. The polycrystalline silicon layer 62 constitutes a write word line WL$_W$. Aluminum wires 66 and 68 are provided in parallel with each other on the above-mentioned layers with a CVD oxide layer 64 interposed in a state intersecting the polycrystalline silicon layers 60 and 62 at right angles. The aluminum wire 66 contacts that end of the polycrystalline silicon layer 56 which lies opposite to that end thereof which contacts the polycrystalline silicon layer 60. That end of the polycrystalline silicon layer 56 forms the drain region of the first MOS FET 12. The aluminum wire 66 acts as a read bit line BL$_R$. The aluminum wire 68 contacts the N$^+$ type semiconductor region 52. The N$^+$ type semiconductor region 52 constitutes the drain region of the second MOS FET 14. The aluminum wire 68 acts as a write bit line BL$_W$. The N$^+$ type semiconductor region 54 acts as the source region of the second MOS FET 14 and also the gate region of the first MOS FET 12. Namely, with second embodiment, the second MOS FET 14 is formed by the ordinary silicon gate process unlike that of the first embodiment. The first MOS FET 12 is formed on a polycrystalline silicon layer mounted on the second MOS FET 14 in such a manner that the gate region of the first MOS FET 12 concurrently acts as the source region of the second MOS FET 14.

With the foregoing embodiments, an N$^+$ type semiconductor region difused in the P type semiconductor substrate was used as the gate region of the MOS FET formed on a polycrystalline silicon layer. However, a polycrystalline silicon layer or aluminum layer may be used as the gate region of the MOS FET. Further, both bit lines and word lines may be formed of a narrow polycrystalline silicon layer, aluminum layer or molybdenum layer.

Figure 8:
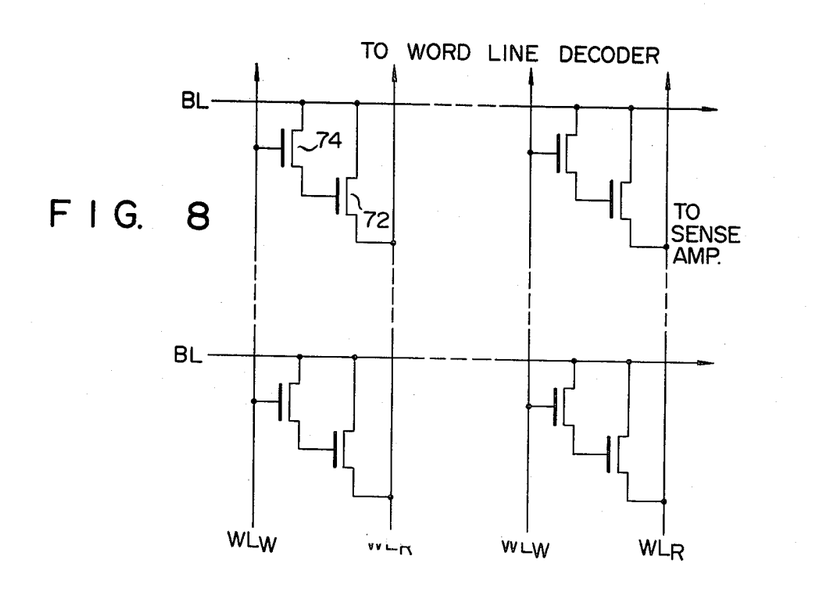
FIG. 8 is an equivalent circuit diagram of a semiconductor memory device according to another embodiment of the invention.

Description is now given of a semiconductor memory device according to still another embodiment of this invention. FIG. 8 shows an equivalent circuit of this other embodiment. One memory cell of this semiconductor memory device is formed of two N channel enhancement type MOS FETs 72 and 74. The gate electrode of a first MOS FET 72 is connected to the source electrode of a second MOS FET 74. The junction of the gate and source electrodes acts as a memory node. The source and drain electrodes of the first MOS FET 72 are respectively connected to a read word line $WL_R$ and a bit line BL. The drain and gate electrodes of the second MOS FET 74 are respectively connected to the bit line BL and write word line $WL_W$. The word lines are connected to a word line decoder. The bit lines are connected to a sense amplifier. The sense amplifier is selectively connected to an I/O bus line in accordance with the voltage level of an output signal from a bit line decoder.

Figure 9:
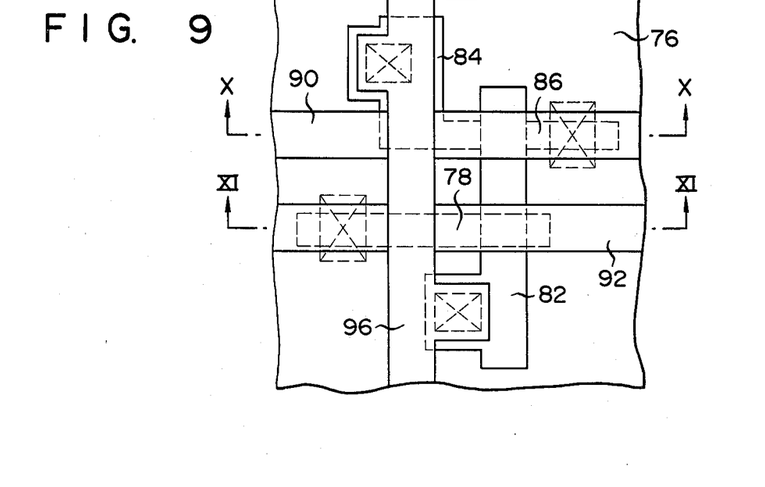
FIG. 9 illustrates an integrated pattern of one memory cell of the semiconductor memory device of FIG. 8.
Figure 10:
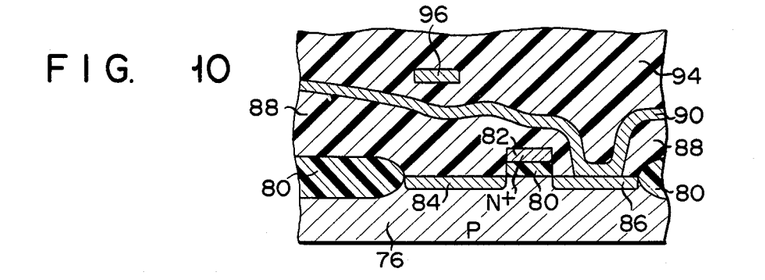
FIG. 10 is a sectional view on line X—X of FIG. 9.
Figure 11:
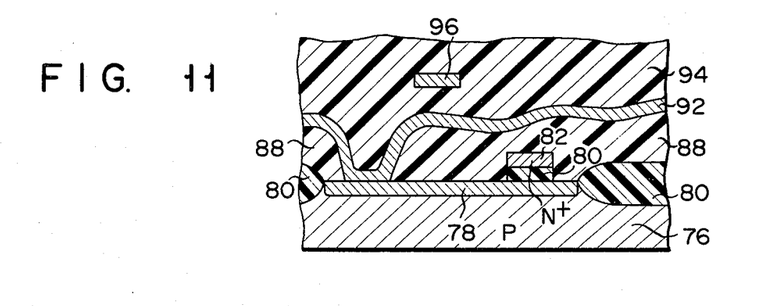
FIG. 11 is a sectional view on line XI—XI of FIG. 9.

Description is now given of the arrangement of one of the memory cells integrated in accordance with the embodiment of FIG. 8. FIG. 9 indicates a pattern of one of the integrated memory cells. FIG. 10 is a sectional view on line X—X of FIG. 9. FIG. 11 is a sectional view on line XI—XI of FIG. 9. An elongated N+ type semiconductor region 78 is diffused in the surface region of a P type silicon substrate 76. A polycrystalline silicon layer 82 is formed on the P type silicon substrate 76 with an oxide layer 80 interposed therebetween in a state intersecting the N+ type semiconductor region 78 at right angles. N+ type semiconductor regions 84 and 86 are diffused in the surface region of the P type substrate 76 with the polycrystalline silicon layer 82 used as a mask. As in the embodiment of FIG. 9, the first MOS FET 72 is formed of the polycrystalline silicon layer 82 and N+ type semiconductor regions 84 and 86. The second MOS FET 74 is formed of the N+ type semiconductor region 78 and polycrystalline silicon layers 82.

Elongated polycrystalline silicon layer 90 and 92 are deposited in parallel with each other on the P type silicon substrate 76 and polycrystalline silicon layer 82 with a CVD oxide layer 88 interposed. The polycrystalline silicon layer 90 contacts the N+ type semiconductor region 86. Since the N+ type semiconductor region 86 is used as the source region of the first MOS FET 72, the polycrystalline silicon layer 90 acts as the read word line $WL_R$. The polycrystalline layer 92 contacts the N+ type semiconductor region 78. Since the N+ type semiconductor region 78 is used as the gate region of the second MOS FET 74, the polycrystalline silicon layer 92 acts as the write word line $WL_W$. An aluminum wire 96 is provided on the above-mentioned layers and regions with a CVD oxide layer 94 interposed. The aluminum wire 96 contacts the polycrystalline silicon layer 82 and N+ semiconductor region 84 to be used as the bit line BL. With the embodiment of FIG. 9, the polycrystalline silicon layer acting as the gate region of the first MOS FET concurrently constitutes the second MOS FET, and only one bit line is provided, ensuring far higher integration.

Description is now given of the operation of a semiconductor memory device according to the embodiment of FIG. 8. Reading is carried out in the same manner as in the foregoing embodiments. Where data previously read out is written, then the bit line BL is set at the opposite level to that at which the bit line BL is set for the reading mode. For example, where the bit line BL is set at a high level in reading, then the bit line BL has to be set at a low level in writing the previously read out data.

If, in the embodiment of FIG. 8, the first MOS FET 72 is of the P channel type, and the second MOS FET 74 is of the N channel type, that is, a memory cell is constituted by a CMOS circuit, then the resultant semiconductor memory device will be more easily operated.

The memory node is set at a low level with respect to data denoted by the binary code "0," and at a high level with respect to data represented by the binary code "1."

In the initial stage, the bit line BL and read word line $WL_R$ are set at a high level, and the write word line $WL_W$ is set at a low level.

In reading, the read word line $WL_R$ is set at a low level. Where data denoted by the binary code "1" is stored, that is, the memory node is set at a high level, then the first MOS FET 72 is rendered nonconducting, preventing the level of the bit line BL from falling. Conversely where data represented by the binary code "0" is stored, that is, the memory node is set at a low level, then the first MOS FET 72 is rendered conducting. As a result, current flows from the bit line BL to the read word line $WL_R$, causing the potential of the bit line BL to drop. After reading is brought to end, the bit line BL is set at a high level, where data of the binary code "1" is stored, and at a low level, where data of the binary code "0" is stored. Where, therefore, the previously read out data is written, it is advised to set the bit line BL at the same level as used in reading and also set the memory node at the same level as that of the bit line BL with the write word line $WL_W$ set at a high level. Where fresh data is written, it is advised to set the bit line BL at a level corresponding to the binary code of the fresh data with the word line maintained at a high level.

Throughout the foregoing embodiments, certain regions of an MOS FET were optically defined as a source and drain. Obviously, the designation of the source and drain may be reversed.

What is claimed is:

1. A semiconductor memory device including a first MOS field effect transistor and a second MOS field effect transistor having a current path connected at one end to the gate electrode of the first MOS field effect transistor, the device comprising:

a semiconductor substrate of a first conductivity type constituting the channel of either of said first MOS field effect transistor or said second MOS field effect transistor;

a first polycrystalline semiconductor layer deposited on said semiconductor substrate and having an oxide layer interposed therebetween, said first polycrystalline semiconductor layer forming the channel of the other of the first MOS field effect transistor and the second MOS field effect transistor;

a first semiconductor region of the second conductivity type formed in the surface region of said semiconductor substrate such that one end portion of said first semiconductor region is positioned below the central portion of said first polycrystalline semiconductor layer; and a second polycrystalline semiconductor layer formed on said semiconductor substrate and having an oxide layer interposed therebetween, one end portion of said second polycrystalline semiconductor layer being mounted on the central portion of said first semiconductor region, and wherein both end portions of said first polycrystalline semiconductor layer optionally act as the drain and source regions of the first MOS field effect transistor, one end portion of said first semiconductor region forming the gate region of said first MOS field effect transistor, the other end portion of said first semiconductor region comprising the source and drain regions of said second MOS field effect transistor with said second polycrystalline semiconductor layer interposed therebetween, and said second polycrystalline semiconductor layer constituting the gate region of said second MOS field effect transistor.

2. A semiconductor memory device according to claim 1 further comprising:
 a read word line connected to the source region of said first MOS field effect transistor;
 a read bit line connected to the drain region of said first MOS field effect transistor;
 a write word line connected to the gate region of said second MOS field effect transistor; and
 a write bit line connected to the drain region of said second MOS field effect transistor.

3. A semiconductor memory device according to claim 1 further comprising:
 a read word line connected to the source region of said first MOS field effect transistor;
 a write word line connected to the gate region of said second MOS field effect transistor; and
 a bit line connected to the drain region of said first MOS field effect transistor and the drain region of said second MOS field effect transistor.

4. A semiconductor memory device including a first MOS field effect transistor and a second MOS field effect transistor having a current path connected at one end to the gate electrode of the first MOS field effect transistor, the device comprising:
 a semiconductor substrate of a first conductivity type constituting the channel of either of said first MOS field effect transistor or said second MOS field effect transistor;
 a first polycrystalline semiconductor layer deposited on said semiconductor substrate;
 an oxide layer interposed between said first polycrystalline semiconductor layer and said semiconductor substrate, said first polycrystalline semiconductor layer forming the channel of the other of said first MOS field effect transistor and said second MOS field effect transistor;
 a first semiconductor region of a second conductivity type formed in the surface region of said semiconductor substrate below one end portion of said first polycrystalline semiconductor layer;
 second and third semiconductor regions of said second conductivity type formed in the surface region of said semiconductor substrate on opposite sides of the other end portion of said first polycrystalline semiconductor layer, said second and third semiconductor regions optionally constituting the drain and source regions of said first MOS field effect transistor, the other end portion of said first polycrystalline semiconductor layer functioning as the gate region of said first MOS field effect transistor, said one end portion of said first polycrystalline semiconductor layer forming the source and drain regions of said second MOS field effect transistor with said first semiconductor region interposed therebetween, and said first semiconductor region forming the gate region of said second MOS field effect transistor;
 a read word line connected to the source region of said first MOS field effect transistor;
 a read bit line connected to the drain region of said first MOS field effect transistor;
 a write word line connected to the gate region of said second MOS field effect transistor; and
 a write bit line connected to the drain region of said second MOS field effect transistor.

5. A semiconductor memory device including a first MOS field effect transistor and a second MOS field effect transistor having a current path connected at one end to the gate electrode of the first MOS field effect transistor, the device comprising:
 a semiconductor substrate of a first conductivity type constituting the channel of either of said first MOS field effect transistor or said second MOS field effect transistor;
 a first polycrystalline semiconductor layer deposited on said semiconductor substrate;
 an oxide layer interposed between said first polycrystalline semiconductor layer and said semiconductor substrate, said first polycrystalline semiconductor layer forming the channel of the other of said first MOS field effect transistor and said second MOS field effect transistor;
 a first semiconductor region of a second conductivity type formed in the surface region of said semiconductor substrate below one end portion of said first polycrystalline semiconductor layer;
 second and third semiconductor regions of said second conductivity type formed in the surface region of said semiconductor substrate on opposite sides of the other end portion of said first polycrystalline semiconductor layer, said second and third semiconductor regions optionally constituting the drain and source regions of said first MOS field effect transistor, the other end portion of said first polycrystalline semiconductor layer functioning as the gate region of said first MOS field effect transistor, said one end portion of said first polycrystalline semiconductor layer forming the source and drain regions of said second MOS field effect transistor with said first semiconductor region interposed therebetween, and said first semiconductor region forming the gate region of said second MOS field effect transistor;
 a read word line connected to the source region of said first MOS field effect transistor;
 a write word line connected to the gate region of said second MOS field effect transistor; and
 a bit line connected to the drain region of the first MOS field effect transistor and the drain region of said second MOS field effect transistor.

6. The semiconductor memory device according to claim 2 further comprising decoder means connected to said write word line and said read word line, and, in the initial stage, for keeping said read word line charged, and, at the time of reading, for causing said read word line to be discharged.

7. The semiconductor memory device according to claim 3 further comprising decoder means connected to said write word line and said read word line, and, in the initial stage, for keeping said read word line charged, and, at the time of reading, for causing said read word line to be discharged.

8. The semiconductor memory device according to claim 4 further comprising decoder means connected to said write word line and said read word line, and, in the initial stage, for keeping said read word line charged, and, at the time of reading, for causing said read word line to be discharged.

9. The semiconductor memory device according to claim 5 further comprising decoder means connected to said write word line and said read word line, and, in the initial stage, for keeping said read word line charged, and, at the time of reading, for causing said read word line to be discharged.

10. A semiconductor memory device including a plurality of matrix-arranged memory cells, each of said memory cells being provided with a first MOS field effect transistor and a second MOS field effect transistor having a current path connected at one end to the gate electrode of the first MOS field effect transistor, the memory device comprising:
  a semiconductor substrate of a first conductivity type forming the channel of either of the first MOS field effect transistor or the second MOS field effect transistor of each memory cell;
  a plurality of first polycrystalline semiconductor layers formed on said semiconductor substrate;
  a plurality of oxide layers singly interposed between said plurality of first polycrystalline semiconductor layers and said semiconductor substrate, each of said plurality of first polycrystalline semiconductor layers forming the channel of the other of the first MOS field effect transistor and the second MOS field effect transistor of a different one of the memory cells;
  a plurality of first semiconductor regions of a second conductivity type formed in the surface region of said semiconductor substrate such that one end portion of each of said plurality of first semiconductor regions is disposed below the central portion of a different one of each of said plurality of first polycrystalline semiconductor layers;
  a plurality of second polycrystalline semiconductor regions formed on said semiconductor substrate; and
  a second plurality of oxide layers singly disposed between one end portion of each of said plurality of second polycrystalline semiconductor regions and a central portion of a corresponding one of said plurality of first semiconductor regions, both end portions of each of said plurality of first polycrystalline semiconductor layers being optionally used as the drain and source regions of a corresponding one of the first MOS field effect transistors, said one end portion of each of said plurality of first semiconductor regions forming the gate region of said corresponding one of the first MOS field effect transistors, the other end portion of each of said plurality of first semiconductor regions forming a source and drain region of a corresponding one of said second MOS field effect transistors, one of said plurality of second polycrystalline semiconductor layers being interposed between corresponding ones of said plurality of first semiconductor regions and said second MOS field effect transistors, each of said plurality of second polycrystalline semiconductor layers forming the gate region of said corresponding one of said second MOS field effect transistors.

11. The semiconductor memory device according to claim 10 further comprising:
  a plurality of read word lines, each of said read word lines being connected to the source regions of each of the first MOS field effect transistors of a respective column;
  a plurality of read bit lines, each of said read bit lines being connected to the drain regions of each of the first MOS field effect transistors of a respective row;
  a plurality of write word lines, each of said write word lines being connected to the gate regions of each of the second MOS field effect transistors of a respective column; and
  a plurality of write bit lines, each of said write bit lines being connected to the drain regions of the second MOS field effect transistors of a respective row.

12. The semiconductor memory device according to claim 10 further comprising:
  a plurality of read word lines, each of said read word lines being connected to the source regions of each of the first MOS field effect transistors of a respective column;
  a plurality of write word lines, each of said write word lines being connected to the gate regions of each of the second MOS field effect transistors of a respective column; and
  a plurality of bit lines, each of said bit lines being connected to the drain regions of each of the first MOS field effect transistors and the second MOS field effect transistors of a respective row.

13. A semiconductor memory device including a plurality of matrix-arranged memory cells, each of the memory cells including a first MOS field effect transistor and a second MOS field effect transistor having a current path connected at one end to the gate electrode of the corresponding first MOS field effect transistor, the memory device comprising:
  a semiconductor substrate of a first conductivity type forming the channel of either of the first MOS field effect transistor or the second MOS field effect transistor of each of the memory cells;
  a plurality of first polycrystalline semiconductor layers formed on said semiconductor substrate;
  a plurality of oxide layers singly interposed between corresponding ones of said first polycrystalline semiconductor layers and said semiconductor substrate, each of said first polycrystalline semiconductor layers forming the channel of the other of the first MOS field effect transistor and the second MOS field effect transistor of a respective one of the memory cells;
  a plurality of first semiconductor regions of a second conductivity type formed on the surface region of said semiconductor substrate such that each of said first semiconductor regions is positioned below one end portion of a respective one of said first polycrystalline semiconductor layers;
  a plurality of second and third semiconductor regions formed in the surface region of said semiconductor substrate on opposite sides of the other end portion of respective first polycrystalline semiconductor layers, said plurality of second and third semiconductor regions being optionally used as the drain and source regions of respective first MOS field effect transistors, said other end of each of said plurality of first polycrystalline semiconductor layers being used as the gate region of respective ones of the first MOS field effect transistors, said one end portion of each of said plurality of first polycrystalline semiconductor layers optionally forming the source and drain regions of each of a respective one of the second MOS field effect transistors, the first semiconductor region being interposed between said first polycrystalline semiconductor layer and the corresponding second MOS field effect transistor, the plurality of first semiconductor regions constituting the gate regions of respective second MOS field effect transistors;

a plurality of read word lines, each of said read word lines being connected to the source regions of each of the first MOS field effect transistors of a respective column;

a plurality of read bit lines, each of said read bit lines being connected to the drain regions of each of the first MOS field effect transistors of a respective row;

a plurality of write word lines, each of said write word lines being connected to the gate regions of each of the second MOS field effect transistors of a respective column; and a plurality of write bit lines, each of said write bit lines being connected to the drain regions of each of the second MOS field effect transistors of a respective row.

14. A semiconductor memory device including a plurality of matrix-arranged memory cells, each of the memory cells including a first MOS field effect transistor and a second MOS field effect transistor having a current path connected at one end to the gate electrode of the corresponding first MOS field effect transistor, the memory device comprising:

a semiconductor substrate of a first conductivity type forming the channel of either of the first MOS field effect transistor or the second MOS field effect transistor of each of the memory cells;

a plurality of first polycrystalline semiconductor layers formed on said semiconductor substrate;

a plurality of oxide layers singly interposed between corresponding ones of said first polycrystalline semiconductor layers and said semiconductor substrate, each of said first polycrystalline semiconductor layers forming the channel of a respective one of the other of the first MOS field effect transistor or the second MOS field effect transistor of a respective one of the memory cells;

a plurality of first semiconductor regions of a second conductivity type formed on the surface region of said semiconductor substrate such that each said first semiconductor region is positioned below one end portion of a respective one of said first polycrystalline semiconductor layers;

a plurality of second and third semiconductor regions formed in the surface of said semiconductor substrate on opposite sides of the other end portion of respective ones of said first polycrystalline semiconductor layers, said plurality of second and third semiconductor regions being optionally used as the drain and source regions of respective first MOS field effect transistors, said other end of each of said plurality of first polycrystalline semiconductor layers being used as the gate region of a respective one of the first MOS field effect transistors, said one end portion of each of said plurality of first polycrystalline semiconductor layers optionally forming the source and drain regions of a respective one of the second MOS field effect transistors, each of the first semiconductor region being interposed between a respective one of said first polycrystalline semiconductor layers and a corresponding second MOS field effect transistor, the plurality of first semiconductor regions constituting the gate regions of respective second MOS field effect transistors;

a plurality of read word lines, each of said read word lines being connected to the source regions of each of the first MOS field effect transistors of a respective column;

a plurality of write word lines, each of said write word lines being connected to the gate regions of each of the second MOS field effect transistors of a respective column; and a plurality of bit lines, each of said bit lines being connected to the drain regions of each of the first MOS field effect transistors and the second MOS field effect transistors of a respective row.

15. A semiconductor memory device according to claim 11 further including decoder means connected to said plurality of write word lines and said plurality of read word lines, and, in an initial stage, keeping all of said read word lines charged, and, at the time of reading, causing a selected read word line to be discharged.

16. A semiconductor memory device according to claim 12 further including decoder means connected to said plurality of write word lines and said plurality of read word lines, and, in an initial stage, keeping all of said read word lines charged, and, at the time of reading, causing a selected read word line to be discharged.

17. A semiconductor memory device according to claim 13 further including decoder means connected to said plurality of write word lines and said plurality of read word lines, and, in an initial stage, keeping all of said read word lines charged, and, at the time of reading, causing a selected read word line to be discharged.

18. A semiconductor memory device according to claim 14 further including decoder means connected to said plurality of write word lines and said plurality of read word lines, and, in an initial stage, keeping all of said read word lines charged, and, at the time of reading, causing a selected read word line to be discharged.

* * * * *